US009319787B1

(12) United States Patent
Chu

(10) Patent No.: US 9,319,787 B1
(45) Date of Patent: Apr. 19, 2016

(54) ESTIMATION OF TIME DELAY OF ARRIVAL FOR MICROPHONE ARRAYS

(71) Applicant: Rawles LLC, Wilmington, DE (US)

(72) Inventor: Wai Chung Chu, San Jose, CA (US)

(73) Assignee: Amazon Technologies, Inc., Seattle, WA (US)

( * ) Notice: Subject to any disclaimer, the term of this patent is extended or adjusted under 35 U.S.C. 154(b) by 162 days.

(21) Appl. No.: 14/135,320

(22) Filed: Dec. 19, 2013

(51) Int. Cl.
*H04R 3/00* (2006.01)
*H03G 5/00* (2006.01)

(52) U.S. Cl.
CPC .................................... *H04R 3/005* (2013.01)

(58) Field of Classification Search
CPC .................................. H04R 3/005; H03G 5/00
USPC ...................................... 381/92, 120, 122, 98
See application file for complete search history.

(56) References Cited

U.S. PATENT DOCUMENTS 7,418,392 B1 8/2008 Mozer et al.
7,711,127 B2 * 5/2010 Suzuki ................ G10L 21/0272 381/113
7,720,683 B1 5/2010 Vermeulen et al.
7,774,204 B2 8/2010 Mozer et al.
8,218,786 B2 * 7/2012 Koga ..................... H04R 3/005 381/122
2012/0223885 A1 9/2012 Perez
2012/0294456 A1 * 11/2012 Jiang et al. ...................... 381/92

FOREIGN PATENT DOCUMENTS

WO W02011088053 A2 7/2011

OTHER PUBLICATIONS

Pinhanez, "The Everywhere Displays Projector: A Device to Create Ubiquitous Graphical Interfaces", IBM Thomas Watson Research Center, Ubicomp 2001, Sep. 30-Oct. 2, 2001, 18 pages.

* cited by examiner

*Primary Examiner* — Thjuan K Addy
(74) *Attorney, Agent, or Firm* — Lee & Hayes, PLLC

(57) ABSTRACT

The accuracy and computationally efficient estimation of time different (or delay) of arrival (TDOA) data is improved for localization of a sound. In one aspect, for each acoustic source event, multiple sets of TDOA data are generated, where each set uses a different sensor or microphone to be the reference. One of the microphones is ultimately selected to be the reference microphone based, in part, on correlation functions of the various sets of TDOA data. The selected reference microphone is then used in sound source localization or other signal processing applications. The direction of the sound source is found using a VMRL finding algorithm as a function of a channel vector containing information of the selected channels, the reference channel and a TDOA vector.

20 Claims, 9 Drawing Sheets

ESTIMATION OF TIME DELAY OF ARRIVAL FOR MICROPHONE ARRAYS

BACKGROUND

Acoustic signals such as handclaps or finger snaps may be used as input within augmented reality environments. In some instances, systems and techniques may attempt to determine the locations of these acoustic sources within these environments. Prior to determining the location of the source, a set of time-difference-of-arrival (TDOA) is found, which can be used to solve for the source location. Traditional methods of estimating the TDOA are sensitive to distortions introduced by the environment and frequently produce erroneous results. What is desired is a robust method for estimating the TDOA that is accurate under a variety of detrimental effects including noise and reverberation.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
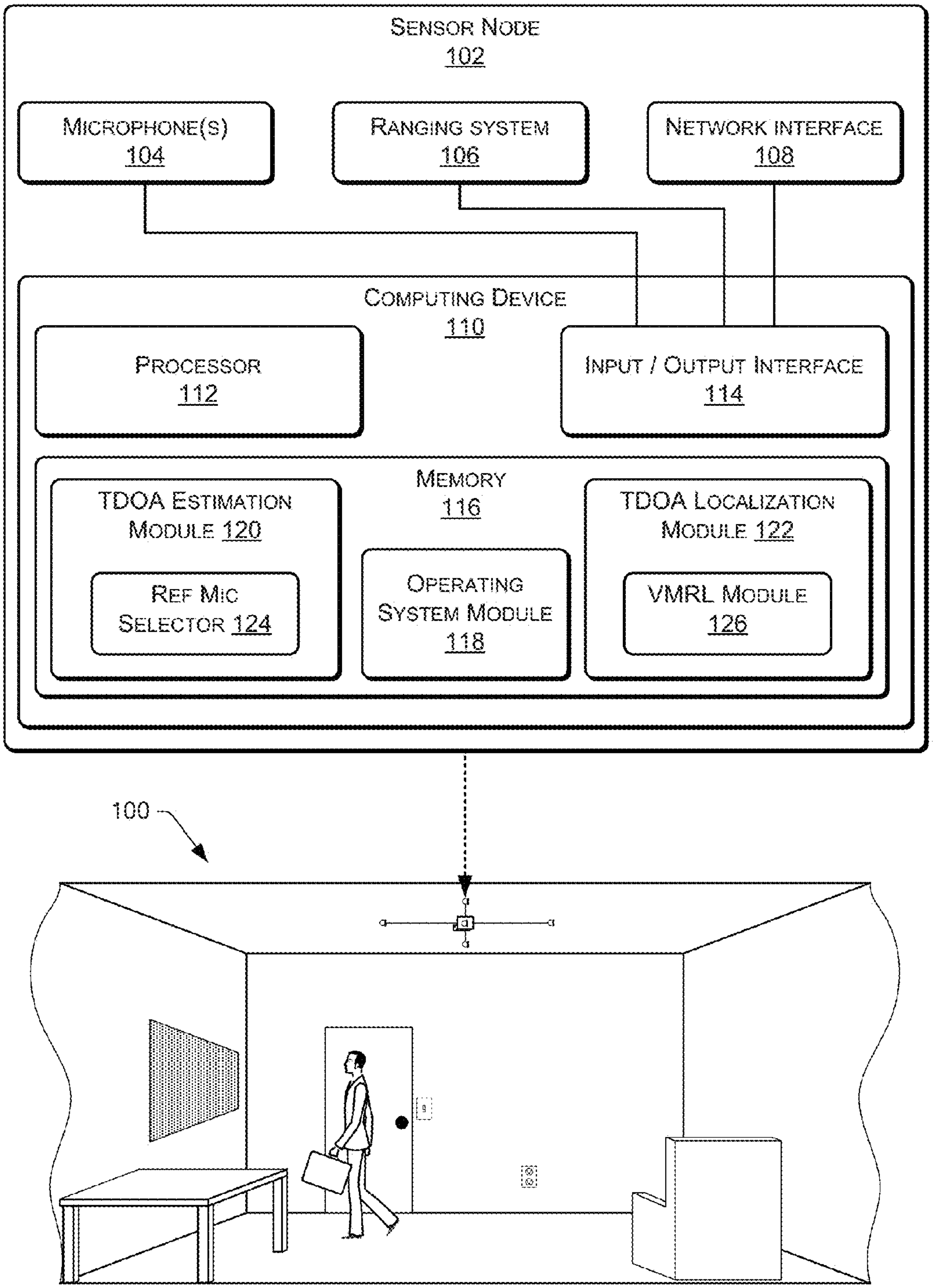
FIG. 1 shows an illustrative scene with a sensor node configured to determine spatial coordinates of an acoustic source which is deployed in an example room, which may comprise an augmented reality environment as described herein.

Augmented reality environments may utilize acoustic signals such as audible gestures, human speech, audible interactions with objects in the physical environment, and so forth for input. Detection of these acoustic signals provides for minimal input, but richer input modes are possible where the acoustic signals may be localized or located in space. For example, a handclap at chest height may be ignored as applause while a handclap over the user's head may call for execution of a special function.

A plurality of microphones may be used to detect an acoustic source. By measuring the time of arrival of the acoustic signal at each of the microphones, and given a known position of each microphone relative to one another, time-difference (or delay)-of-arrival data is generated. This time-difference-of-arrival (TDOA) data may be used for hyperbolic positioning to calculate the location of the acoustic source. The acoustic environment, particularly with audible frequencies (including those extending from about 300 Hz to about 3 KHz), are signal and noise rich. Furthermore, acoustic signals interact with various objects in the physical environment, including users, furnishings, walls, and so forth. These interactions may result in reverberations, which in turn introduce variations in the TDOA data. These variations may result in significant and detrimental changes to the calculated location of the acoustic source.

Compounding the challenge of reverberations is that TDOA estimation techniques output the results as relative time measurements from each microphone with respect to an arbitrarily chosen, but otherwise predefined reference microphone. The same reference microphone is used under all conditions and at all times. In practice, the problem with this approach is that one or more microphones may produce weak or corrupted signals due to various conditions, including occlusion, physical damage, or general malfunctioning. Fixing the reference to a single microphone may further lead to a situation where a bad signal from one microphone might corrupt the results of the whole array.

Disclosed herein are devices and techniques for determining the TDOA values for acoustic signals in which a reference microphone may be selected for each localization event and data from any microphones containing inadequate, distorted, or unusable signals may be discarded. Microphones may be disposed in a pre-determined physical arrangement having known locations relative to one another. Once an audio event emanates from an acoustic source (such as a tapping command), the techniques compute multiple sets of TDOA values from the signals produced by the microphones. In each iteration, the techniques use or try a different sensor or microphone to be the reference. In one implementation, a correlation sum is derived for each set of TDOA data. All of the sets of TDOA values are evaluated and an effective reference microphone for the acoustic source is selected. In one approach, one of the microphones is ultimately selected to be the reference microphone based, in part, on which TDOA data set yields the lowest correlation sum. In some cases, the techniques may further determine whether to include or exclude data from certain microphones that may be corrupted due to malfunctioning, occlusion, or some other cause.

Once the reference microphone is selected, the selected reference microphone and associated TDOA values (with or without all of the microphones participating) is used in the calculation of the spatial coordinates of the acoustic source of the audio event, thereby localizing the acoustic source, or in other signal processing applications. In some implementations, the localization calculations may use a Valin-Michaud-Rouat-Letourneau (VMRL) direction finding algorithm to increase robustness and accuracy.

This process is repeated for subsequent audio events, resulting in different microphones being used as the reference microphone for different acoustic sources. The techniques greatly improve the robustness of acoustic source localization. Problems associated with interference from reverberation, occlusion, physical damage, or general malfunctioning are reduced or eliminated.

ILLUSTRATIVE ENVIRONMENT

FIG. 1 shows an illustrative environment 100 of a room with a sensor node 102. The sensor node 102 is configured to determine spatial coordinates of an acoustic source in the room, such as may be used in an augmented reality environment or other contexts. The sensor node 102 may be positioned at various locations around the room, such as on the ceiling, on a wall, on a table, floor mounted, and so forth.

As shown here, the sensor node 102 incorporates or is coupled to a microphone array 104 having a plurality of microphones configured to receive acoustic signals. A ranging system 106 may also be present to provide another method of measuring the distance to objects within the room. The ranging system 106 may comprise laser range finder, acoustic range finder, optical range finder, structured light module, and so forth. The structured light module may comprise a structured light source and camera configured to determine position, topography, or other physical characteristics of the environment or objects therein based at least in part upon the interaction of structured light from the structured light source and an image acquired by the camera.

A network interface 108 may be configured to couple the sensor node 102 with other devices placed locally such as within the same room, on a local network such as within the same house or business, or remote resources such as accessed via the internet. In some implementations, components of the sensor node 102 may be distributed throughout the room and configured to communicate with one another via cabled or wireless connection.

The sensor node 102 may include a computing device 110 with one or more processors 112, one or more input/output interfaces 114, and memory 116. The memory 116 may store an operating system 118, time-difference-of-arrival (TDOA) estimation module 120, and TDOA-based localization module 122. In some implementations, resources among a plurality of computing devices 110 may be shared. These resources may include input/output devices, processors 112, memory 116, and so forth. The memory 116 may include computer-readable storage media ("CRSM"). The CRSM may be any available physical media accessible by a computing device to implement the instructions stored thereon. CRSM may include, but is not limited to, random access memory ("RAM"), read-only memory ("ROM"), electrically erasable programmable read-only memory ("EEPROM"), flash memory or other memory technology, compact disk read-only memory ("CD-ROM"), digital versatile disks ("DVD") or other optical disk storage, magnetic cassettes, magnetic tape, magnetic disk storage or other magnetic storage devices, or any other medium which can be used to store the desired information and which can be accessed by a computing device.

The input/output interface 114 may be configured to couple the computing device 110 to microphones 104, ranging system 106, network interface 108, or other devices such as an atmospheric pressure sensor, temperature sensor, hygrometer, barometer, an image projector, camera, and so forth. The coupling between the computing device 110 and the external devices such as the microphones 104 and the network interface 108 may be via wire, fiber optic cable, wirelessly, and so forth.

The TDOA estimation module 120 is configured to compute time difference of arrival delay values for use by the TDOA-based localization module 122. When an audio event occurs (e.g., a voice command, a barking dog, a tapping input, etc.), the TDOA estimation module 120 iterates through multiple sets of microphones in the array 104, using different microphone as the reference microphone for each iteration. The TDOA estimation module 120 has a reference microphone selector 124 that evaluates the various sets of TDOA values and determines which set of microphones and reference microphone are most effective at localizing the sound source. In one implementation, the microphone selector 124 of the TDOA estimation module 120 computes correlation sums for each TDOA dataset, and choses the reference microphone as a function of those correlation sums. This implementation will be described in more detail below.

The TDOA-based localization module 122 is configured to use differences in arrival time of acoustic signals received by the microphones 104 to determine source locations of the acoustic signals. In some implementations, the TDOA-based localization module 122 may be configured to accept data from the sensors accessible to the input/output interface 114. For example, the TDOA-based localization module 120 may determine time-differences-of-arrival based at least in part upon changes in temperature and humidity.

In some implementations, the TDOA estimation module 122 may further employ a module 126 the leverages the Valin-Michaud-Rouat-Letourneau (VMRL) direction finding algorithm to increase robustness and accuracy. The VMRL module 126 receives as inputs the set of TDOA values associated with the selected reference channel and calculates a direction vector. This will be discussed in more detail below.

Figure 2:
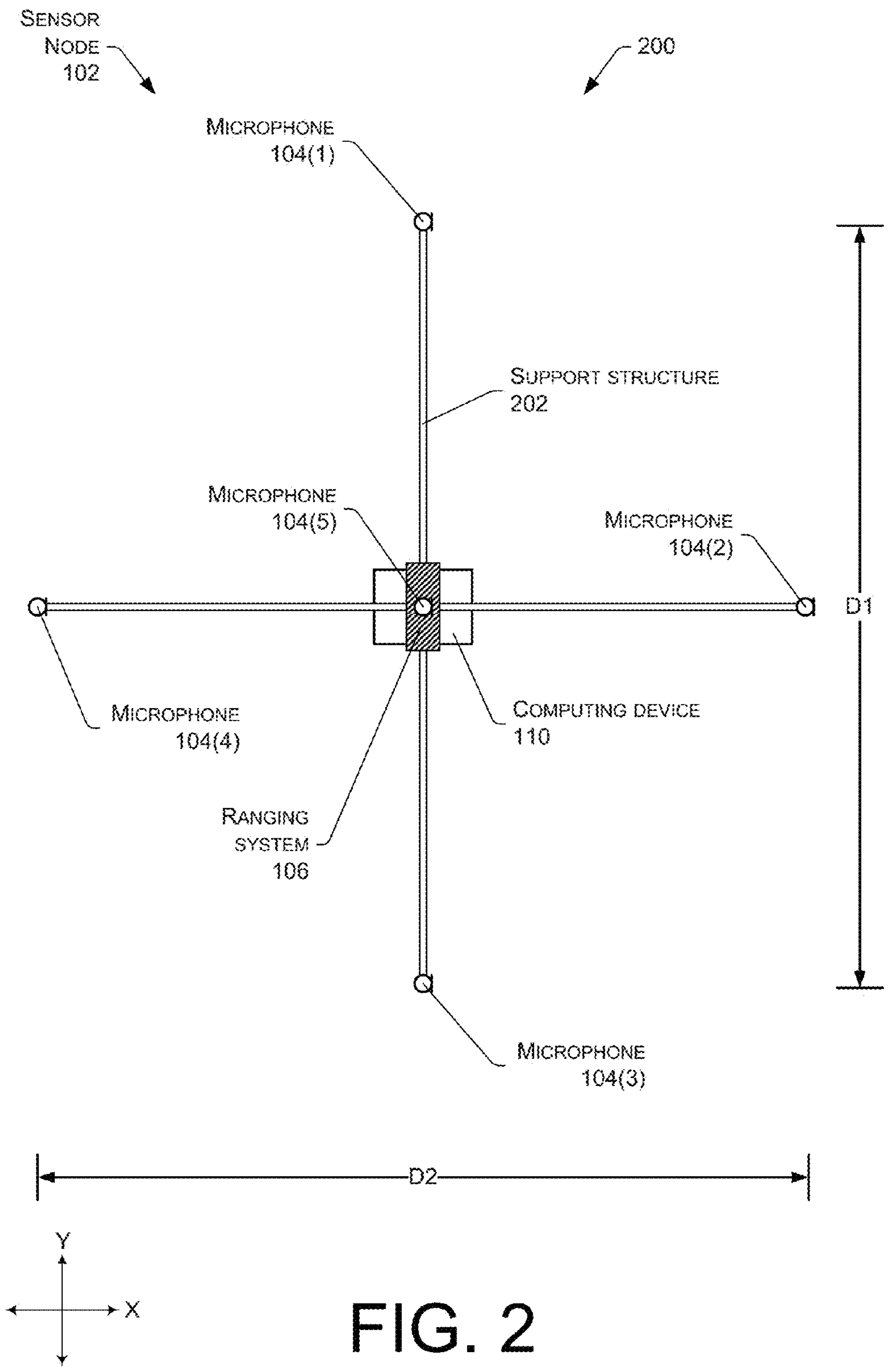
FIG. 2 shows an illustrative sensor node including a plurality of microphones deployed at pre-determined locations within the example room of FIG. 1.

FIG. 2 shows an example illustration 200 of the sensor node 102 coupled to a microphone array 104 of five microphones. The array 104 has a support structure 202 formed as a cross with two linear members disposed perpendicular to one another, each having length of D1 and D2. The support structure 202 aids in maintaining a known pre-determined distance between the microphones that may then be used in the determination of the spatial coordinates of the acoustic source. Five microphones 104(1)-(5) are disposed on the structure 202, with four microphones 104(1)-104(4) at the ends of each arm of the cross and a fifth microphone 104(5) at the center of the cross. It is understood that the number and placement of the microphones, as well as the shape of the support structure 202, may vary. For example, in other implementations, the support structure may exhibit a triangular, circular, or another geometric shape. One particular example arrangement includes an annular ring of six microphones encircling a seventh microphone in the middle. In some implementations, an asymmetrical support structure shape, distribution of microphones, or both may be used.

The support structure 202 may comprise part of the structure of a room. For example, the microphones 104(1)-(5) may be mounted to the walls, ceilings, floor, and so forth at known locations within the room. In some implementations, the microphones 104 may be emplaced, and their position relative to one another determined through other sensing means, such as via the ranging system 106, structured light scan, manual entry, and so forth.

The ranging system 106 is also depicted as part of the sensor node 102. As described above, the ranging system 106 may utilize optical, acoustic, radio, or other range finding techniques and devices. The ranging system 106 may be configured to determine the distance, position, or both between objects, users, microphones 104(1)-(5), and so forth. For example, in one implementation, the microphones 104(1)-(5) may be placed at various locations within the room and their precise position relative to one another determined using an optical range finder configured to detect an optical tag disposed upon each.

In another implementation, the ranging system 106 may comprise an acoustic transducer and the microphones 104 may be configured to detect a signal generated by the acoustic transducer. For example, a set of ultrasonic transducers may be disposed such that each projects ultrasonic sound into a particular sector of the room. The microphones 104(1)-(5)

may be configured to receive the ultrasonic signals, or dedicated ultrasonic microphones may be used. Given the known location of the microphones relative to one another, active sonar ranging and positioning may be provided.

Figure 3:
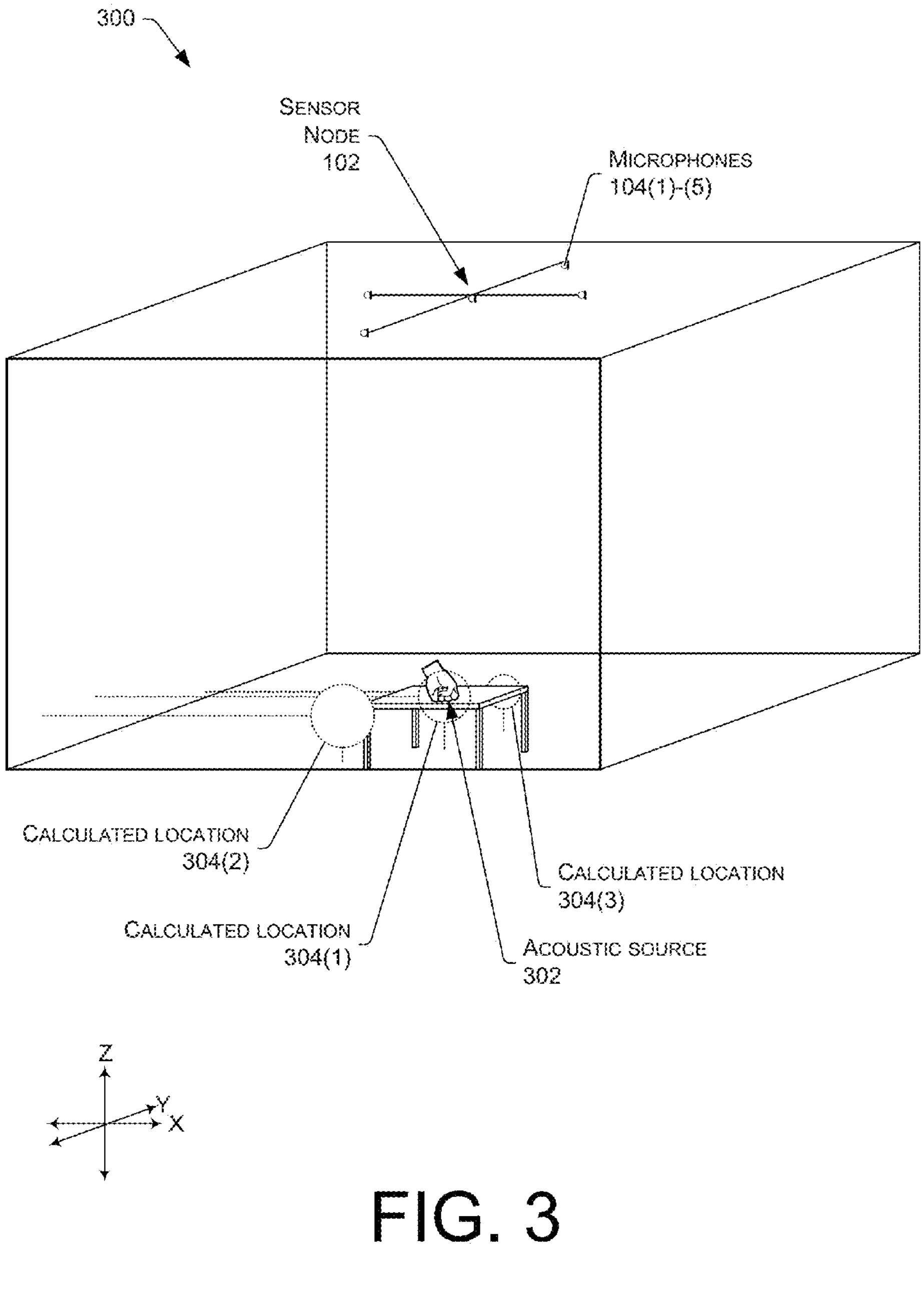
FIG. 3 depicts an illustrative volume, such as a room, and depicts an acoustic source originated by a user tapping a table and a calculated location for the acoustic source.

FIG. 3 depicts an illustrative room 300 or other such volume. In this illustration, the sensor node 102 is disposed on the ceiling while an acoustic source 302, such as a first knocking on a tabletop, generates an acoustic signal. This acoustic signal propagates throughout the room and is received by the microphones 104(1)-(5). Data from the microphones 104(1)-(5) about the signal is then passed along via the input/output interface 114 to the TDOA estimation module 120 in the computing device 110. The TDOA estimation module 120 uses the data to generate multiple sets of TDOA values. However, because of environmental conditions such as noise, reverberation, occlusion, and so forth, as well as possible physical damage or general malfunctioning, the TDOA values may vary. During this process, the TDOA estimation module 120 invokes the reference microphone selector 124 to analyze the various sets of TDOA values, where each set assumes a different microphone as the reference microphone. For example, in the five microphone array of FIG. 3, the TDOA estimation module 120 may compute a first set of TDOA values using the first microphone 104(1) as the reference microphone. Hence, the TDOA estimation module 120 measures time differences between signals from microphones 104(1) and 104(2), between signals from microphones 104(1) and 104(3), between signals from microphones 104(1) and 104(4), and between signals from microphones 104(1) and 104(5). The TDOA estimation module 120 then computes second, third, fourth, and fifth sets of TDOA values using the second, third, fourth, and fifth microphones as reference microphones, respectively. This yields multiple sets of TDOA values.

The TDOA estimation module 120 invokes the reference microphone selector 124 to analyze the various sets of TDOA values to find the set that provides the best fit for localizing the acoustic source 302. In one implementation, the TDOA estimation module 120 computes correlation values of the various sets and determines the best set as a function of those correlation values. The microphone used as the reference microphone for that set of TDOA data is selected as the reference microphone.

The TDOA-based localization module 122 uses the TDOA values associated with the selected reference microphone to calculate a location of the acoustic source. A calculated location 304(1) using the methods and techniques described herein corresponds closely to the acoustic source 302. In contrast, without the methods and techniques described herein, other less accurate locations 304(2) and 304(3) may be calculated due to reverberations of the acoustic signal, occlusion, damage, and the like.

Illustrative Processes

The following discussion is directed to various processes for estimating TDOA values for acoustic signals for multiple different reference microphones and choosing a set of TDOA values that best localize the sound source. The processes may be implemented by the architectures herein, or by other architectures. In some of the following drawings, the processes are illustrated as a collection of blocks in a logical flow graph. Some of the blocks represent operations that can be implemented in hardware, software, or a combination thereof. In the context of software, the blocks represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described blocks can be combined in any order or in parallel to implement the processes. Furthermore, while the following process describes estimation of TDOA for acoustic signals, non-acoustic signals may be processed as described herein.

Figure 4:
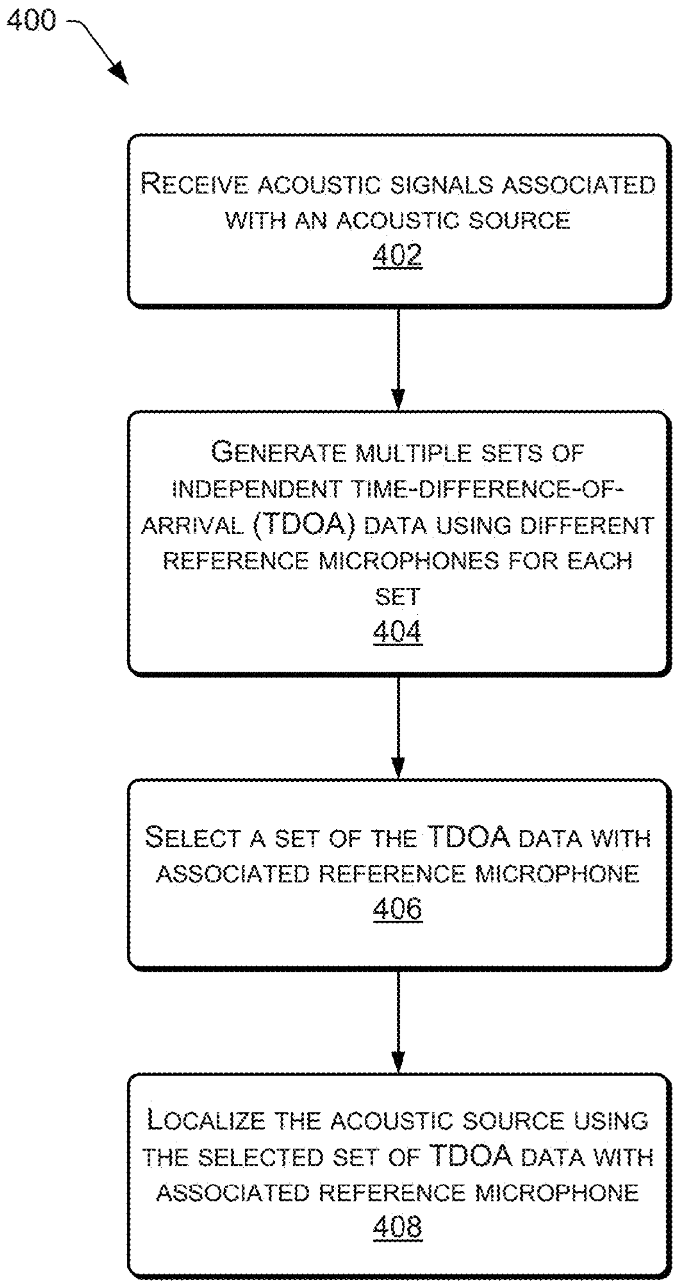
FIG. 4 is an illustrative process for localizing an acoustic source based in part on techniques that estimate multiple sets of time-difference-of-arrival (TDOA) values by trying different microphones as the reference and then selecting the best reference microphone.

FIG. 4 shows a process 400 for localizing an acoustic source based in part on techniques that estimate multiple sets of TDOA values, where each set uses a different microphone as the reference microphone. The process may be performed, for example, by the sensor node 102 using the microphone array of microphones 104(1)-(5).

At 402, acoustic signals associated with an acoustic source in an environment are received. For example, suppose a user intends to convey a command by making an audible sound, such as tapping his first or hand on the table as shown in FIG. 3. When this acoustic event occurs, the microphones 104(1)-(5) receive the acoustic signals originating from the acoustic source (e.g., the point at which the user hit the table). Due to differences in the distance between the acoustic source and each of the microphones, each microphone detects the signal at differing times.

Figure 5:
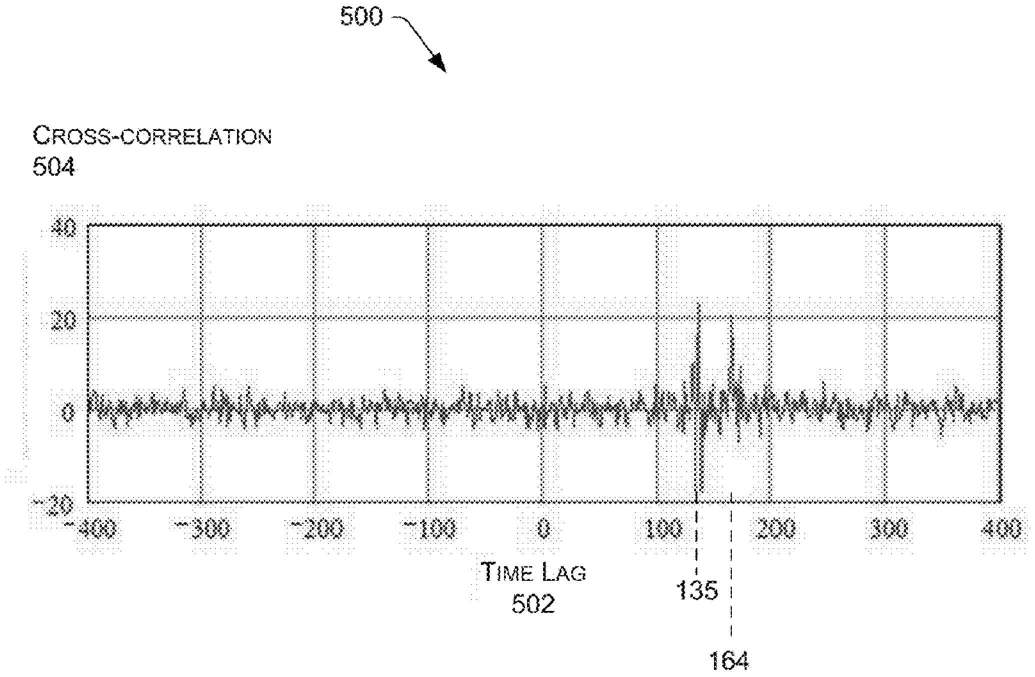
FIG. 5 depicts a graph of cross-correlation values for two illustrative signals calculated using phase transform.

To illustrate, FIG. 5 depicts a graph 500 of cross-correlation values calculated using a phase transform (PHAT) for two illustrative signals. For example, consider two signals, each received by a different microphone in the array 104. Localization of the acoustic source relies on being able to determine that the same signal, or piece of a signal, has been received at different microphones. For example, if the acoustic signal is the user knocking on the table as illustrated in FIG. 3, the process seeks to compare the same knock as received from two different microphones, and not a knock at one microphone and a finger snap at another. Correlation techniques are used to determine if those signals received at different microphones match up.

In this graph, a time lag 502 is measured in milliseconds (ms) along a horizontal axis and a cross-correlation 504 is measured along a vertical axis. Shown are two distinct peaks indicating that the signals have a high degree of cross-correlation. One peak is located at about 135 ms and another is located at about 164 ms. These peaks indicate that the two signals are very similar to one another at two different time lags.

The signals detected at each microphone may also include noise or signal degradation such as reverberations. Accordingly, determining which peak to use is important in accurately localizing the source of the signal. In the optimal situation of an acoustic environment with no ambient noise and no reverberation, a single peak would be present. However, in real-world situations and sound reverberating from walls and so forth, multiple peaks such as shown here appear. Continuing our example, the sound of the user knocking on the tabletop may echo from a wall. The signal resulting from the reverberation of the knocking sound will be very similar to the sound of the knocking itself which arrives directly at the microphone. Inadvertent selection of the peak associated with the reverberation signal would result in a difference in the time lag. During localization, apparently small differences in determining the delay between signals may result in substantial errors in calculated location. For example, given standard pressure and temperature of atmospheric air having a speed of sound of about 340 meters/second, a difference of 29 ms between the two peaks in this graph may result in an error of about 9.8 meters.

Accordingly, TDOA estimation uses approaches aimed at reducing or eliminating such reverberations. In some cases, TDOA estimation employs correlation based methods in which correlations between two signals are computed. Thus, the process 400 may include operations to choose the correct peaks. For instance, given two signals denoted by $s_0[n]$, $s_1[n]$, n=0 to M−1 where n is an integer representing a time index and M is the total number of samples, the cross-correlation for the two signals at a time lag m may be calculated as follows:

$$E\{s_1[n]s_0[n-m]\} = \frac{1}{M-m}\sum_{n=m}^{M-1} s1[n]s_0[n-m].$$

A high cross-correlation at a time lag m implies that the two signals are very similar when the first signal is shifted by m time samples with respect to the second signal. On the other hand, if the cross-correlation is low or negative, it implies that the signals do not share similar structure at a particular time lag. It is thus worthwhile to select the peak which reflects the acoustic signal and not the reverberation, as described next.

With reference again to FIG. 4, at 404, multiple sets of TDOA data is generated. Each set of TDOA data tries a different microphone as the reference microphone. In one implementation, each set of TDOA data may be calculated using correlation-based methods. To describe one example approach, suppose the sensor node has a total of N microphones (e.g., N=5 in the array 104 of FIGS. 2 and 3), with each microphone associated with an index from 0 to N−1; the time of arrival from an acoustic source to a microphone is denoted as $t_1$, i=0 to N−1. The TDOA estimation module selects a first reference microphone or channel, such as microphone 0, and computes TDOA values as follows:

$$t_{1,0}=t_1-t_0,$$

$$t_{2,0}=t_2 t_0,$$

$$t_{N-1,0} t_{N-1}-t_0.$$

For N microphones, there are N−1 TDOA values in a given set. The previous set of TDOAs is sometime referred to as the independent set, since other TDOAs can be derived from it according to:

$$t_{i,j}=t,0-t_{j,0}, i=0 \text{ to } N-1, j=0 \text{ to } N-1.$$

The process is repeated for each microphone being used as the reference microphone. More generally, let N be the number of microphones or channels and M be the number of independent lag and correlation to retain per channel-pair. Then, $$l_{i,j}^{(k)}, R_{i,j}^{(k)}; i,j \in [0,N-1], i \neq j, k, k=0 \text{ to } M-1$$

with l being the set of TDOAs, and R being the correlation measure. The correlation data are sorted from large to small with:

$$R_{i,j}^{(0)} \geq R_{i,j}^{(1)} 9 \geq \ldots \geq R_{i,j}^{(M-1)}.$$

At 406 in FIG. 4, a set of the TDOA data with associated reference microphone is selected. In one implementation, this act involves computing a correlation sum, corr[c], as follows:

$$\text{corr}[c] = \sum_{i=0}^{N-1}\sum_{\substack{j=0,\\ i\neq j,\\ j\neq c}}^{N-1} R_{i,j}^{(0)},\ c = 0 \text{ to } N-1$$

which is the sum of the correlation values between the ith microphone and the jth microphone when the cth microphone is excluded.

In one implementation, the reference microphone (cRef) is selected as a function of correlation values. More specifically, in one approach, the microphone associated with the lowest correlation sum is selected as the reference microphone, since that microphone is likely the one that is the most similar to the rest of the microphones and hence excluding it leads to the largest drop in correlation.

Figure 6:
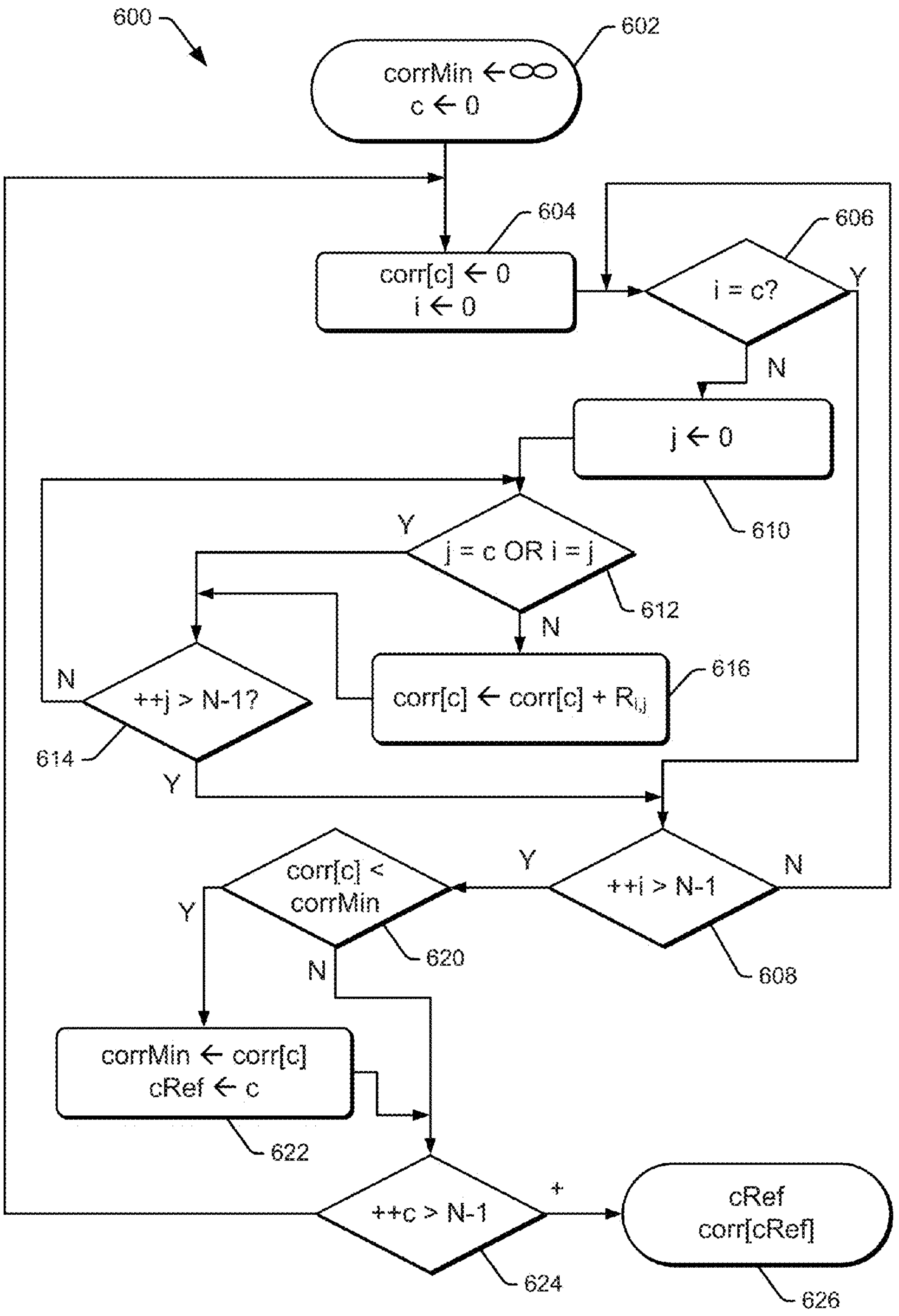
FIG. 6 shows an example process for selecting a reference microphone based on computing correlation sums for the various sets of TDOA values.

FIG. 6 shows one example process 600 for computing the correlation sum corr[c] when a microphone or channel is removed, identifying the index of the reference microphone (cRef), and minimum correlation sum (corrMin). At 602, the minimum correlation sum corrMin is initialized to infinity and the microphone variable c is initialized to zero. At 604, the correlation sum corr[c] and counting variable i are set to zero. The microphone counting variables i and j represent index numbers of the microphones or channels, where five microphones, for example, may be labeled as 0 through 4.

At 606, it is determined whether the microphone counting variable i equals the microphone variable c. That is, is the current iteration of the algorithm addressing two different microphones or the same one? If the same (i.e., the yes or "Y" branch), the process 600 continues to act 608 where the count variable i is incremented and returned to act 606. When the counter i is no longer equal to the microphone variable c (i.e., the no or "N" branch from 606), the second counting variable j is initialized to zero at 610.

At 612, it is determined whether the counting variable j equals the microphone variable c (for the same reasons as noted above with respect to i) or whether the two counting variables are equal. This latter case is checking to make sure this iteration of the algorithm is not comparing the signal from the same microphone. If either case is true (i.e., the yes or "Y" branch from 612), the second counting variable j is incremented at 614. Further, at 614, it is determined whether the incremented value of variable j has reached the limit of N−1, meaning the algorithm has processed through all microphone combinations. If the limit has not been reached (i.e., the no or "N" branch from 614), the process 600 returns to act 612. When the counter variables i and j do not equal the current microphone variable c and do not equal each other (i.e., the no or "N" branch from 612), the correlation measure R for the channel combination i, j is added to the correlation sum corr[c] at 616. Thereafter, the counting variable j is incremented and compared to the limit N−1 at 614.

The process 600 continues through various sets of microphones, and eventually selects the reference microphone cRef. Accordingly, in certain implementations, the process 600 computes a set of correlation sum values corr[c], c=0 to N−1, with the minimum corrMin being equal to the correlation sum of the selected reference microphone corr[cRef], (or corrMin=corr[cRef]).

At 608, once a correlation sum for microphone c is computed for all microphone combinations (i.e., all i and j), the process 600 may continue to 620 where it is determined whether the correlation value for microphone c is less than the correlation minimum corrMin, which was initialized to infinity. If true (i.e., the yes or "Y" branch from 620), the correlation sum for microphone c becomes the new correlation minimum corrMin and the microphone c is tentatively selected as the reference microphone at 622. If not true (i.e., the no or "N" branch from 620), the reference microphone counter c is incremented until all microphones have been tried as the reference microphone at 624. If not all microphones have been tried as the reference microphone (i.e., the no or "N" branch from 624), the process 600 continues using a next reference microphone at 604. Conversely, once all microphones have been tried as the reference microphone (i.e., the yes or "Y" branch from 624), the process 600 selects as the reference microphone that resulted in the lowest correlation sum, and outputs the reference microphone and the correlation sum for that microphone at 626.

In some cases, the microphones may be experiencing some problems or there may be an occlusion blocking the sound path between the acoustic source and the particular microphone. These situations may further cause complications for localizing the acoustic source.

Figure 7:
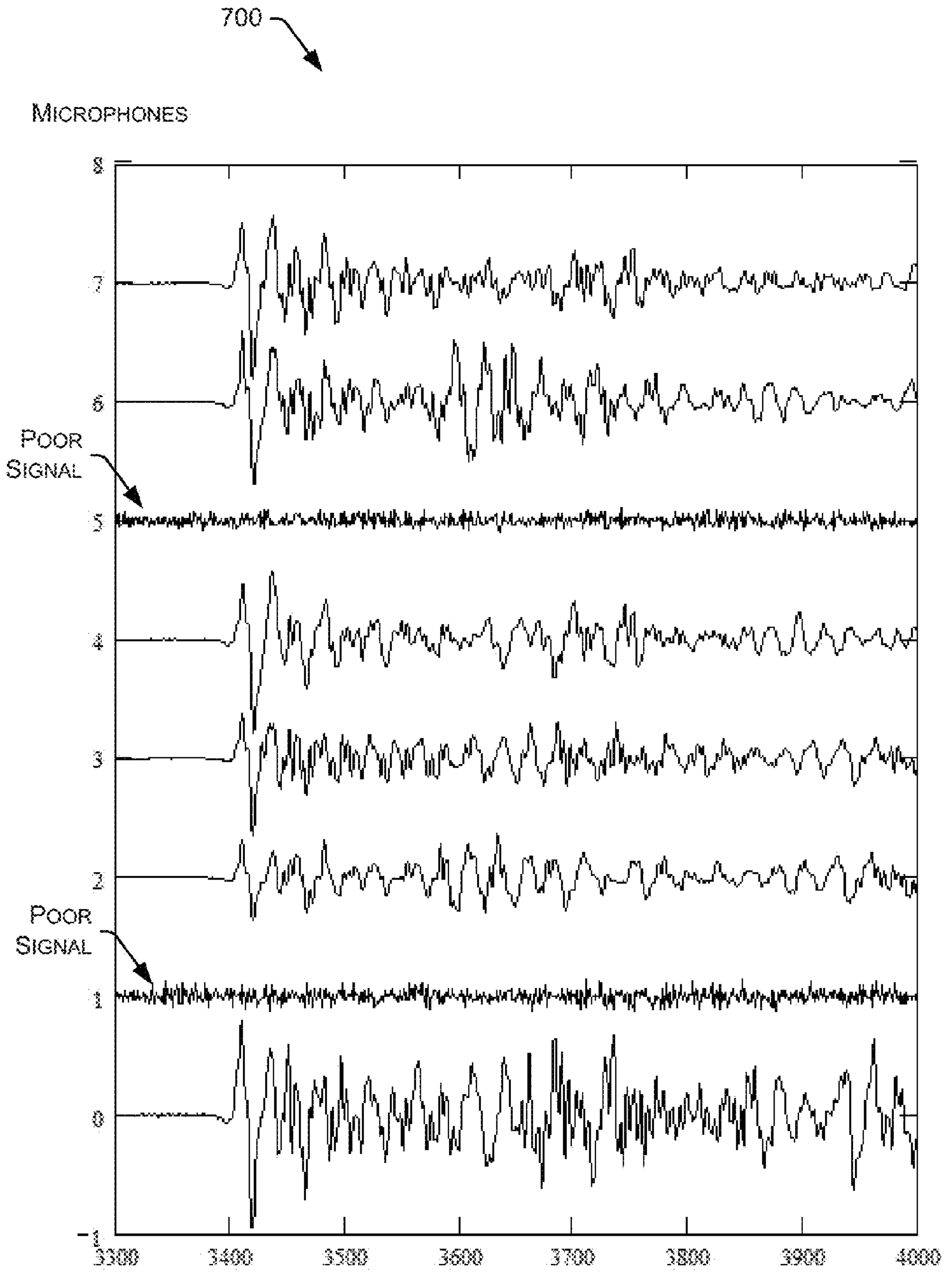
FIG. 7 shows an example set of acoustic signals recorded by an array of eight microphones.

To illustrate, consider FIG. 7 which shows an example set 700 of acoustic signals recorded by an array of eight microphones, as labeled 0-7 along the y-axis. Two of the microphones 1 and 5 are defective or occluded, as the signals output from these microphones exhibit noise that is weakly correlated to the signals the rest of the microphones.

To correct for such situations, the selection process of act 406 in FIG. 4 may further determine whether to include or exclude certain microphones from the analysis. In one implementation, the process 400 determines whether a ratio of the correlation sum of a particular microphone to the correlation sum of a reference microphone exceeds a predetermined threshold cTH, as follows:

$$\frac{\mathrm{corr}[c]}{\mathrm{corrMin}} = \frac{\mathrm{corr}[c]}{\mathrm{corr}[cRef]} > cTH$$

The threshold cTH may be a positive threshold and set as desired for the particular application. One value used in experiments by the inventor was 1.3, with a range of 1 to 1.5 being suitable. Moreover, the value of the threshold cTH may be a design parameter that allows developers to tune their models as desired. Thus, if the previous criterion is satisfied, the correlation sum of the cth microphone is significantly larger than corrMin, which is the correlation sum of the reference microphone. Hence, the cth microphone has provided little contribution and is weakly correlated to other microphones, and can be discarded.

Figure 8:
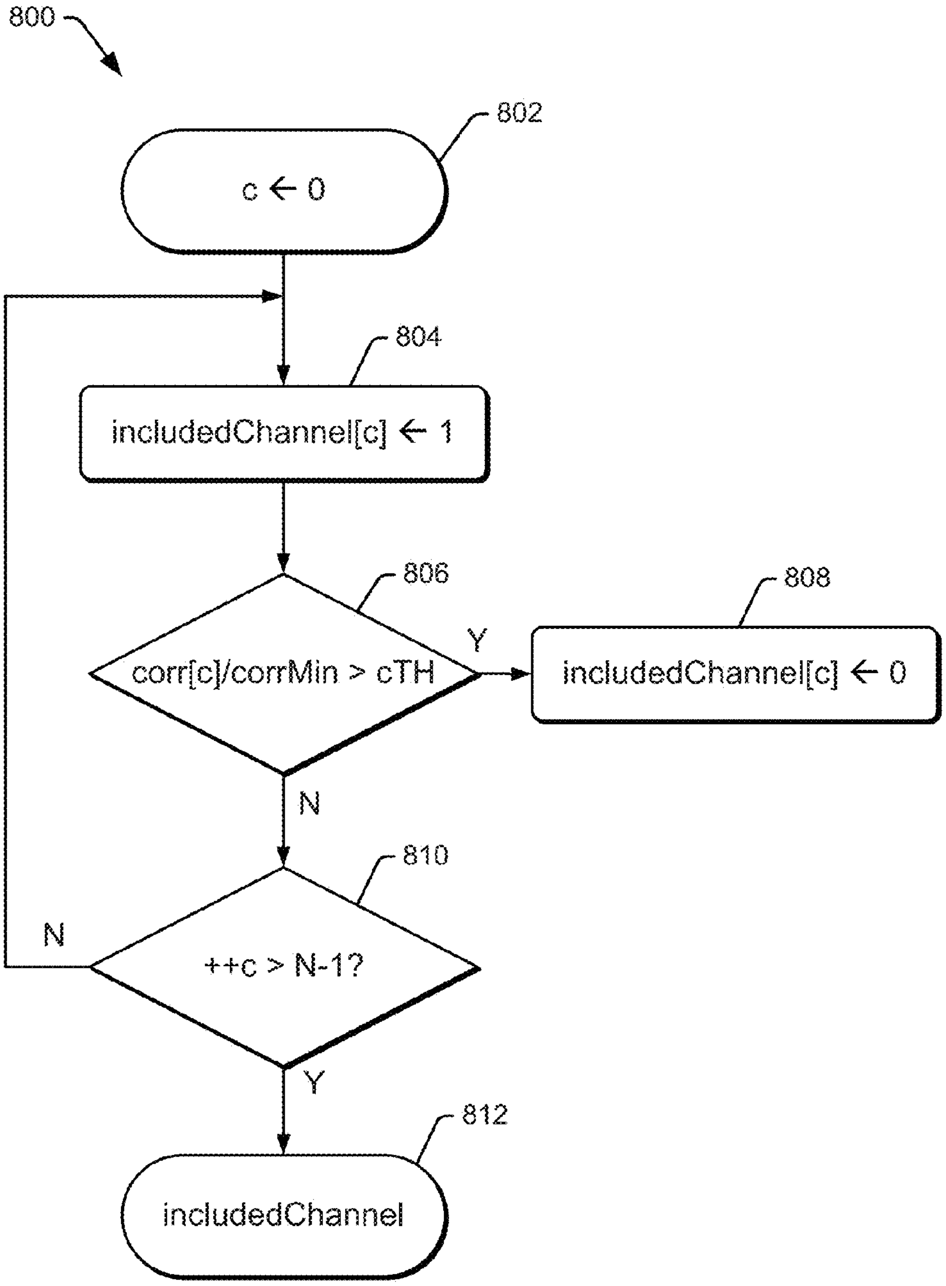
FIG. 8 shows an example process that may be used to determine whether to include or exclude microphones in the TDOA analysis.

FIG. 8 shows an example process 800 that may be used to determine whether to include or exclude microphones in the analysis. At 802, the microphone variable counter c is initialized to zero. At 804, a value includedChannel[c], c=0 to N−1, is set to one. At 806, it is determined whether the ratio of the correlation sum of microphone c to the correlation sum of a reference microphone exceeds the predetermined threshold cTH. If so (i.e., the yes or "Y" branch from 806), the value includedChannel[c] is set to zero at 808. If not (i.e., the no or "N" branch from 806), the value includedChannel[c] remains at one and the counter c is incremented until all microphones are considered at 810. In this way, includedChannel[c]=0 if the cth microphone should be excluded and includedChannel [c]=1 when the cth microphone should be included. If all microphones have been considered (i.e., the yes or "Y" branch from 810), the process completes at 812.

Figure 9:
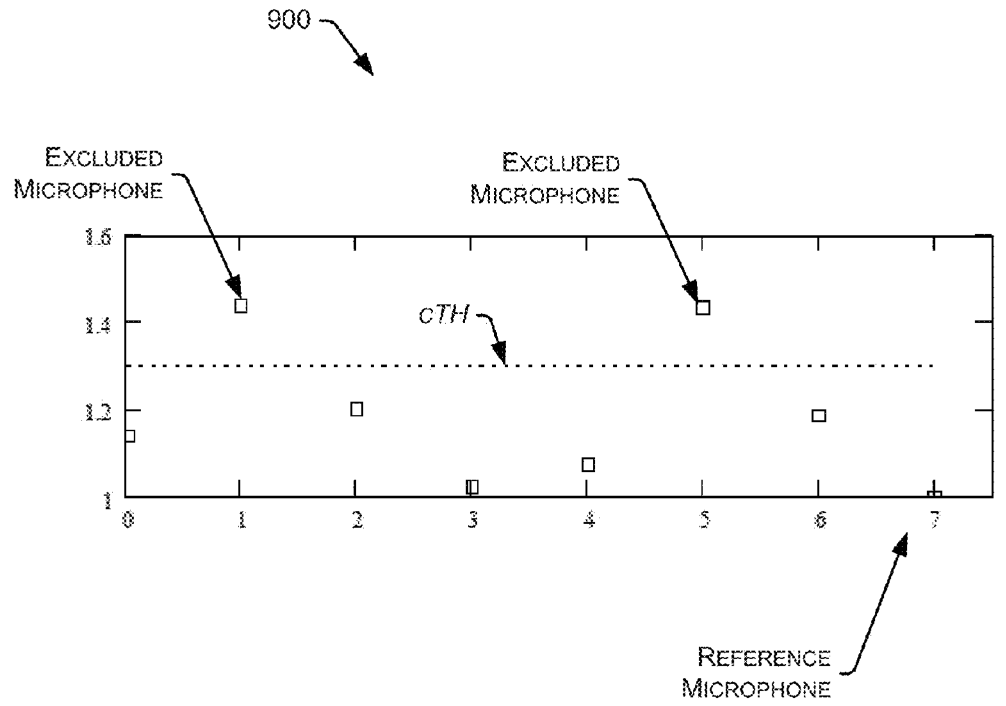
FIG. 9 shows a plot of correlation ratios that are produced by the process of FIG. 8 to determine whether to include or exclude microphones in the TDOA analysis.

FIG. 9 shows a plot 900 of the correlation ratios. The plot also shows the threshold cTH. As clear in this plot, microphones 1 and 5 that exhibited noisy signals of FIG. 7 show ratios above the threshold and hence are excluded from the analysis. Furthermore, the plot 900 shows the reference microphone for this acoustic source is microphone 7.

With reference again to FIG. 4, at 408, the acoustic source is localized using the selected reference microphone and associated set of TDOA data. In one implementation, the index of the reference channel (cRef) is transmitted together with the indices of the rest of the selected channels ($c_i$, i=0 to S−1, where S is the number of included microphones), with the TDOA set being:

$$t_{c_0,cRef}, t_{c_1,cRef}, \ldots, t_{c_{S-1},cRef}$$

In some implementations, the acoustic source may be localized using the Valin-Michaud-Rouat-Letourneau (VMRL) direction finding algorithm to increase robustness and accuracy. The VMRL algorithm receives as inputs the set of TDOA values associated with the selected reference channel and calculates a direction vector.

Let the number of microphones or channels K∈[4, N], and the channel vector is:

$$g = \begin{bmatrix} i_0 \\ i_1 \\ \vdots \\ i_{K-1} \end{bmatrix}$$

with $i_k \in [0, N-1]$, k=0 to K−1 being the indices of the various microphones. Suppose that $i_0$ specifies the reference microphone, and the rest of the indices are sorted from small to large:

$$i_1 < i_2 < \ldots < i_{K-1}.$$

The TDOA vector has K−1 elements and is written as:

$$t = \begin{bmatrix} t_{i_0,i_1} \\ t_{i_0,i_2} \\ \vdots \\ t_{i_0,i_{K-1}} \end{bmatrix}.$$

To solve for the direction vector, let matrix M be as follows:

$$M(g) = \begin{bmatrix} x_{i_1} - x_{i_0} & y_{i_0} - y_{i_0} & z_{i_1} - z_{i_0} \\ x_{i_2} - x_{i_0} & y_{i_2} - y_{i_0} & z_{i_2} - z_{i_0} \\ \vdots & \vdots & \vdots \\ x_{i_{K-1}} - x_{i_0} & y_{i_{K-1}} - y_{i_0} & z_{i_{K-1}} - z_{i_0} \end{bmatrix}$$

which is a function of the channel vector g, then the direction vector a is:

$$a = c \cdot M(g)^{-1} t, K=4$$

or $$a = c \cdot M(g)^{+} t, K>4.$$

The M matrices and their inverses $M^{-1}$ or pseudo-inverses $M^{+}$ can be calculated on a per-demand basis using the channel vector g. Alternately, the M matrices and their inverses can be pre-computed and stored to reduce computational cost. For instance, the M matrices and their inverses $M^{-1}$ may be maintained in a codebook of matrices, where the codebook is addressed by a channel vector. If the channel vector is invalid (i.e., it cannot be used to recover a matrix M from the codebook), the process returns without solving for the direction vector. It is further noted that if the matrix M is singular (i.e., not invertible), the process returns without solving for the direction vector.

CONCLUSION

Although the subject matter has been described in language specific to structural features, it is to be understood that the subject matter defined in the appended claims is not necessarily limited to the specific features described. Rather, the specific features are disclosed as illustrative forms of implementing the claims.

What is claimed is:

1. One or more non-transitory computer-readable media storing computer-executable instructions executable by one or more processors to perform operations comprising:

receiving acoustic signals from an array of at least first, second, and third microphones, the acoustic signals being associated with an acoustic source in an environment;

generating at least first, second, and third sets of time-difference-of-arrival (TDOA) data, wherein the first set of TDOA data is derived from time differences between the acoustic signals of the first microphone and the second microphone relative to the acoustic signal of the third microphone, wherein the second set of TDOA data is derived from time differences between the acoustic signals of the first microphone and the third microphone relative to the acoustic signal of the second microphone, wherein the third set of TDOA data is derived from time differences between the acoustic signals of the second microphone and the third microphone relative to the acoustic signal of the first microphone;

for the first set of TDOA data, computing a correlation function between the acoustic signal from the first microphone and the acoustic signal from the second microphone, while excluding the acoustic signal from the third microphone, to produce a first correlation value;

for the second set of TDOA data, computing a correlation function between the acoustic signal from the first microphone and the acoustic signal from the third microphone, while excluding the acoustic signal from the second microphone, to produce a second correlation value;

for the third set of TDOA data, computing a correlation function between the acoustic signal from the second microphone and the acoustic signal from the third microphone, while excluding the acoustic signal from the first microphone, to produce a third correlation value;

wherein a comparatively higher correlation value implies that two acoustic signals share similar structure when offset by a time lag, and a comparatively lower correlation value implies that two acoustic signals do not share similar structure when offset by the time lag;

determining that the first correlation value is lowest;

selecting, as a reference microphone, the third microphone; and localizing the acoustic source in the environment by computing, in part, a direction to the acoustic source based on one of the first, second, and third sets of TDOA data associated with the reference microphone.

2. The one or more non-transitory computer-readable media of claim 1, wherein generating the first, second, and third sets of time-difference-of-arrival (TDOA) data comprises:

for the first set of TDOA data, subtracting a time at which the acoustic signal reaches the first microphone from a time at which the acoustic signal reaches the third microphone and subtracting a time at which the acoustic signal reaches the second microphone from the time at which the acoustic signal reaches the third microphone;

for the second set of TDOA data, subtracting the time at which the acoustic signal reaches the first microphone from the time at which the acoustic signal reaches the second microphone and subtracting the time at which the acoustic signal reaches the third microphone from the time at which the acoustic signal reaches the second microphone; and for the third set of TDOA data, subtracting the time at which the acoustic signal reaches the second microphone from the time at which the acoustic signal reaches the first microphone and subtracting the time at which the acoustic signal reaches the second microphone from the time at which the acoustic signal reaches the first microphone.

3. The one or more non-transitory computer-readable media of claim 1, further storing computer-executable instructions that, when executed, cause one or more processors to perform acts comprising:

excluding the acoustic signal from the first microphone when a ratio of the correlation value of the first microphone to the correlation value of the selected reference microphone satisfies a predetermined criteria;

excluding the acoustic signal from the second microphone when a ratio of the correlation value of the second microphone to the correlation value of the selected reference microphone satisfies the predetermined criteria; and excluding the acoustic signal from the third microphone when a ratio of the correlation value of the third microphone to the correlation value of the selected reference microphone satisfies the predetermined criteria.

4. The one or more non-transitory computer-readable media of claim 3, wherein the predetermined criteria is a threshold with a value between 1.0 and 1.5, and at least one of the first acoustic signal, the second acoustic signal, and the third acoustic signal are excluded when an associated ratio exceeds the threshold.

5. A computer-implemented method comprising:

receiving acoustic signals from an array of at least first, second, and third microphones, the acoustic signals being associated with an acoustic source in an environment;

generating at least first, second, and third sets of time-difference-of-arrival (TDOA) data, wherein the first set of TDOA data is derived from time differences between the acoustic signals of the first microphone and the second microphone relative to the acoustic signal of the third microphone, wherein the second set of TDOA data is derived from time differences between the acoustic signals of the first microphone and the third microphone relative to the acoustic signal of the second microphone, wherein the third set of TDOA data is derived from time differences between the acoustic signals of the second microphone and the third microphone relative to the acoustic signal of the first microphone;

selecting one of the first, second, and third microphones from the array to be a reference microphone and an associated set of the TDOA data such that if the first microphone is selected, the third set of TDOA data is associated with the first microphone, if the second microphone is selected, the second set of TDOA data is associated with the second microphone, and if the third microphone is selected, the first set of TDOA data is associated with the third microphone; and outputting an identity of the selected reference microphone and the associated set of the TDOA data.

6. The computer-implemented method of claim 5, wherein generating the first, second, and third sets of time-difference-of-arrival (TDOA) data comprises:

for the first set of TDOA data, subtracting a time at which the acoustic signal reaches the first microphone from a time at which the acoustic signal reaches the third microphone and subtracting a time at which the acoustic signal reaches the second microphone from the time at which the acoustic signal reaches the third microphone;

for the second set of TDOA data, subtracting the time at which the acoustic signal reaches the first microphone from the time at which the acoustic signal reaches the second microphone and subtracting the time at which the acoustic signal reaches the third microphone from the time at which the acoustic signal reaches the second microphone; and for the third set of TDOA data, subtracting the time at which the acoustic signal reaches the second microphone from the time at which the acoustic signal reaches the first microphone and subtracting the time at which the acoustic signal reaches the second microphone from the time at which the acoustic signal reaches the third microphone.

7. The computer-implemented method of claim 5, wherein selecting the reference microphone comprises:

for the first set of TDOA data, computing a correlation function between the acoustic signal from the first microphone and the acoustic signal from the second microphone, while excluding the acoustic signal from the third microphone, to produce a first correlation value;

for the second set of TDOA data, computing a correlation function between the acoustic signal from the first microphone and the acoustic signal from the third microphone, while excluding the acoustic signal from the second microphone, to produce a second correlation value;

for the third set of TDOA data, computing a correlation function between the acoustic signal from the second microphone and the acoustic signal from the third microphone, while excluding the acoustic signal from the first microphone, to produce a third correlation value;

wherein a comparatively higher correlation value implies that two acoustic signals share similar structure when offset by a time lag, and a comparatively lower correlation value implies that two acoustic signals do not share similar structure when offset by the time lag;

determining which of the first, second, and third correlation values is lowest; and selecting, as a reference microphone, one of the first microphone, the second microphone, or the third microphone that was excluded in the computation of the first, second, and third correlation values that is determined to be lowest.

8. The computer-implemented method of claim 7, further comprising:

excluding the acoustic signal from the first microphone when a ratio of the correlation value of the first microphone to the correlation value of the selected reference microphone satisfies a predetermined criteria;

excluding the acoustic signal from the second microphone when a ratio of the correlation value of the second microphone to the correlation value of the selected reference microphone satisfies the predetermined criteria; and excluding the acoustic signal from the third microphone when a ratio of the correlation value of the third microphone to the correlation value of the selected reference microphone satisfies the predetermined criteria.

9. The computer-implemented method of claim 5, further comprising localizing the acoustic source, at least in part, by computing a Valin-Michaud-Rouat-Letourneau (VMRL) direction finding algorithm.

10. A system comprising:

a plurality of sensors to detect a sound emanating from an acoustic source in an environment, the plurality of sensors including at least a first sensor, a second sensor and a third sensor;

a time-difference-of-arrival estimation module coupled to receive, from the plurality of sensors, signals indicative of a detected sound, wherein the time-difference-of-arrival estimation module is configured to:

generate multiple sets of time-difference-of-arrival (TDOA) data;

associate the first sensor as a first reference sensor with a first set of the multiple sets of TDOA data;

associate the second sensor as a second reference sensor with a second set of the multiple sets of TDOA data, wherein the first reference sensor is different from the second reference sensor;

associate the third sensor as a third reference sensor with a third set of the multiple sets of TDOA data; and select, based on the multiple sets of TDOA data, one of the first, second or third sensors to be a reference sensor for the detected sound.

11. The system of claim 10, wherein the TDOA estimation module is further configured to compute correlation sums for the first, second and third set of the multiple sets of the TDOA data and select, as the reference sensor for the detected sound, one of the first, second or third sensors associated with the first, second or third set of the multiple sets of the TDOA data that yields the lowest correlation sum.

12. The system of claim 10, further comprising a TDOA localization module configured to localize the acoustic source in the environment using, at least in part, the reference sensor for the detected sound and the associated set of the first, second or third sets of the multiple sets of the TDOA data.

13. The system of claim 10, wherein the TDOA estimation module is further configured to determine whether to exclude a signal from a particular one of the first, second or third sensors as a function of a ratio of a correlation sum of the particular one sensor to a correlation sum of the reference sensor for the detected sound.

14. A system comprising:

a plurality of sensors to detect a sound emanating from an acoustic source in an environment; and a time-difference-of-arrival estimation module coupled to receive, from the plurality of sensors, signals indicative of the detected sound and configured to generate multiple sets of time-difference-of-arrival (TDOA) data, wherein each of the sets of TDOA data chooses a different sensor from the plurality of sensors to be a reference sensor, and to evaluate the multiple sets of TDOA data to select one of the sensors to be the reference sensor; and a TDOA localization module configured to localize the acoustic source in the environment using, at least in part, the reference sensor and an associated set of the TDOA data, the TDOA localization module finding a direction to the acoustic source by computing a matrix M as follows:

$$M(g) = \begin{bmatrix} x_{i_1} - x_{i_0} & y_{i_0} - y_{i_0} & z_{i_1} - z_{i_0} \\ x_{i_2} - x_{i_0} & y_{i_2} - y_{i_0} & z_{i_2} - z_{i_0} \\ \vdots & \vdots & \vdots \\ x_{i_{K-1}} - x_{i_0} & y_{i_{K-1}} - y_{i_0} & z_{i_{K-1}} - z_{i_0} \end{bmatrix}$$

where the matrix M is a function of a channel vector g and determining a direction vector a as:

$$a = c \cdot M(g)^{-1} t, K=4$$

or $$a = c \cdot M(g)^{+} t, K>4.$$

15. The system of claim 14, wherein the TDOA localization module further computes the inverse matrix $M^{-1}$.

16. The system of claim 15, wherein the TDOA localization module further computes the M matrices and the inverse matrices $M^{-1}$ on demand for each new set of inputs.

17. The system of claim 15, wherein the TDOA localization module accesses a codebook that maintains the M matrices and the inverse matrices $M^{-1}$.

18. The system of claim 10, wherein associating the first sensor as the first reference sensor is predetermined.

19. The system of claim 10, wherein the second reference sensor is different from the third reference sensor.

20. The system of claim 10, wherein the first set of the multiple sets of the TDOA data is derived from time differences between the acoustic signals of the first sensor and the second sensor relative to the acoustic signal of the third sensor, wherein the second set of TDOA data is derived from time differences between the acoustic signals of the first sensor and the third sensor relative to the acoustic signal of the second sensor, and wherein the third set of TDOA data is derived from time differences between the acoustic signals of the second sensor and the third sensor relative to the acoustic signal of the first sensor.

* * * * *